United States Patent [19]

Castillero

[11] 4,024,631

[45] May 24, 1977

[54] PRINTED CIRCUIT BOARD PLATING PROCESS

[75] Inventor: Alphonso W. Castillero, Upland, Calif.

[73] Assignee: Xerox Corporation, Stamford, Conn.

[22] Filed: Nov. 24, 1975

[21] Appl. No.: 634,977

[52] U.S. Cl. .............................. 29/625; 156/656; 156/659; 204/32 R; 427/96; 427/98

[51] Int. Cl.² .......................................... B41M 3/08

[58] Field of Search .................... 29/624, 625, 626; 174/68.5; 427/96, 98, 97, 123, 125; 204/14 N, 14 R, 23, 24, 32 R, 35 R, 43 R, 43 N, 49; 156/2, 3, 4, 7, 8

[56] References Cited

UNITED STATES PATENTS

| | | | |
|---|---|---|---|
| 3,579,376 | 5/1971 | Vincent | 427/97 |
| 3,666,549 | 5/1972 | Rhodenizer et al. | 427/98 |
| 3,742,597 | 7/1973 | Davis | 29/625 |
| 3,854,973 | 12/1974 | Mersereau et al. | 427/98 X |

OTHER PUBLICATIONS

Coombs, Printed Circuits Handbook, McGraw-Hill, 1967, pp. 5-38, 39, 40, 41, 42, 43, 44.

Primary Examiner—James R. Duzan
Attorney, Agent, or Firm—James J. Ralabate; Allen S. Melser; Franklyn C. Weiss

[57] ABSTRACT

A process for manufacturing printed circuit boards wherein a layer of Nickel is plated atop a layer of copper in a pattern corresponding to a desired circuit configuration. The Nickel is used as an etch resist to remove copper from the board in the non-conductive areas. Subsequently, the Nickel is chemically activated such that it will accept a coating of solder particularly at the connection points and in the through-holes.

34 Claims, 1 Drawing Figure

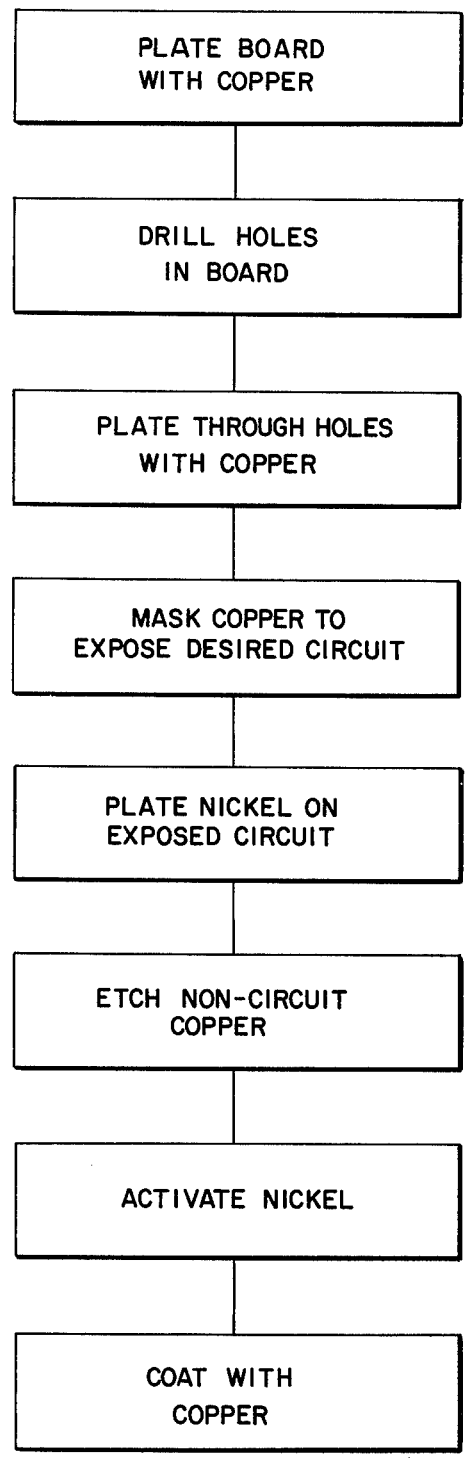

PRINTED CIRCUIT BOARD PLATING PROCESS

BACKGROUND OF THE INVENTION

1. Field of the Invention

This invention relates to the manufacture of printed circuit boards and more particularly to the use of nickel as an etch resist in forming the conductive areas of the board.

2. Description of the Prior Art

In the past, printed circuit boards have been produced by a process in which the copper conductors were formed by coating the copper conductors and throughholes with nickel and subsequently plating a layer of gold thereon. The gold was used as an etch resist, after the application of which the excess copper was removed by etching. Since the etchant did not attack gold, the result of the process was a desired circuit configuration. Even when new etchants were developed which did not attack nickel, gold was used to provide solderability since nickel could not be soldered for mounting components on the board. This method was obviously expensive because of the heavy use of gold. As gold prices increased, the cost of board manufacture also increased.

SUMMARY OF THE INVENTION

To overcome the problems associated with prior art processes for board manufacture, the instant invention provides a method for using nickel as an etch resist and then chemically activating the nickel to allow solder to adhere thereto. Gold need be plated only on the board edge connectors, if any.

BRIEF DESCRIPTION OF THE DRAWING

FIG. 1 is a flow diagram of the process according to the instant invention.

DETAILED DESCRIPTION OF A PREFERRED EMBODIMENT

The flow diagram of FIG. 1 describes the process of the instant invention.

Onto a blank printed circuit board, which may be of any convenient type such as epoxy glass construction with holes into which the leads from components to be mounted upon the board will be inserted, a copper electroless plating step deposits a thin layer of copper on the board and through the through-holes to establish conductivity from one side of the board to the other.

A mask is applied to the copper surface leaving as exposed copper only the areas which will form the conductive elements of the circuit board and any contacts and lands associated therewith. This may be done by applying a mask by a silk screen process or by applying a photosensitive mask and imaging the desired circuit configuration thereon after which the conductive traces are electroplated with additional copper as required.

The board, with the mask still in place over the non-conductive copper areas is subjected to a plating operation whereby nickel is coated over the copper in the desired circuit configuration. The plating may be a thickness of 0.1 to 1 mil. The mask on the non-circuit copper is stripped from the board and the board is subjected to an alkaline etchant which etches away the exposed copper but which does not attack the nickel now covering the circuit copper. A suitable etchant is one of several commercial proprietary solutions such as Continuetch by Macdermid Inc.

At the conclusion of this portion of the process, a board remains with a coating of copper in the conductive areas which is in turn covered by a layer of nickel.

The nickel is utilized to provide strength to the conductive areas of the board and also to prevent bleed-through of the copper into the covering layers. If copper is allowed to bleed-through the covering layers which will subsequently be soldered, the copper oxide formed by the bleed-through provides a poor electrical contact and results in unusable boards or boards with a short shelf-life.

If the board has edge connectors, such as may be used in circuit boards for electronic computing devices, for example, the edge connectors, or tabs, must be coated with a highly conductive material in order to provide an excellent electrical contact. Gold has been a preferred coating for such contacts. It should be noted, however, that only the tabs themseleves need be coated with gold, instead of the entire circuit configuration as has been the practice in the past.

In the past, a layer of gold would be plated over the entire conductive area to provide solderability, since nickel generally could not be easily soldered. This, of course, was wasteful of gold.

Following the plating of the edge connectors with gold, the edge connectors may be masked to prevent the gold from being removed during subsequent processing steps. Additionally, other portions of the board to which solder is not to be applied may be masked.

In order to provide solderability of the nickel, the nickel must be activated by dipping the board in a solution which may comprise a chloride of a metal such as palladium chloride or stannous chloride and hydrochloric acid together with a wetting agent. Some usable wetting agents are non-ionic wetting agents such as Triton X-100 sold by Rohm and Hass Co., Neodol 25-9 sold by Shell, or Sterox W J sold by Monsanto. Other possible substances to be used with the hydrocloric acid and wetting agent include zinc chloride or the chlorides of precious metals. Additional preparation steps such as scrubbing, cleaning, and the like may also be performed.

Following activation of the nickel, the board is subjected to a flow of molten solder which adheres to the nickel coated portions of the board and in the through-holes. The solder may be applied by any of the known techniques including dipping the board in a pool of molten solder and vibrating the board in a bath of molten wax or oil to remove the excess solder and to control the thickness of deposition thereof, or by a hot-air solder leveling technique whereby the board is dipped in a pool of molten solder, and, as it is withdrawn, a blast of hot air removed the excess solder from the board and the through-holes.

The completion of this step provides a finished board ready for fabrication and component mounting. After the components are inserted into the through-holes of the board it is run through a wave soldering machine to electrically bond the components to the board.

In the following Examples, hydrochloric acid, reagent grade (37% by volume) is used.

EXAMPLE 1

A solution of Hydrochloric acid, reagent grade (10% by wt.), Stannous Chloride, anhydrous (1.5% by wt.) and palladium chloride (1.0% by wt.) is constituted in water with the water and a wetting agent comprising the remaining percentage of solution by weight. A board with a plating of nickel on portions thereof is immersed in the solution for 50 to 60 seconds at 22 ± 2° C. After drying, solder is applied by a hot-air solder leveling technique and the result is a good electrical and mechanical bond between the nickel and solder.

EXAMPLE 2

A solution of hydrochloric acid, reagent grade (17% by wt.), stannous chloride, anhydrous (2.5% by wt.) and palladium chloride (0.5% by wt.) is constituted in water with the water and a wetting agent comprising the remaining percentage of solution by weight. A board with a plating of nickel on portions thereof is immersed in the solution for 25 to 35 seconds at 22°±2° C. After drying, solder is applied by a hot-air solder leveling technique and the result is a good electrical and mechanical bond between the nickel and solder.

EXAMPLE 3

A solution of hydrochloric acid, reagent grade (22% by wt.), stannous Chloride, anhydrous (3.5% by wt.) and palladium chloride (2.0% by wt.) is constituted in water with the water and a wetting agent comprising the remaining percentage of solution by weight. A board with a plating of nickel on portions thereof is immersed in the solution for 15 to 25 seconds at 22±2° C. After drying, solder is applied by a hot-air solder leveling technique and the result is a good electrical and mechanical bond between the nickel and solder.

It is to be understood that the above-described arrangement is merely illustrative of the principles of the invention. While a particular embodiment of the present invention has been described and illustrated, it will be apparent to those skilled in the art that changes and modifications may be made therein without departure from the spirit and scope of the invention as claimed.

What is claimed is:

1. A method for producing printed circuit boards comprising:
   a. preparing the board with exposed copper in the circuit pattern desired,
   b. plating nickel over the exposed copper,
   c. etching away any copper not covered by nickel,
   d. applying a solder mask to expose only nickel areas to be covered with solder,
   e. activating the nickel to accept solder, and
   f. applying solder to the nickel.

2. A method as set forth in claim 1 wherein activating the nickel comprises treating the nickel with a solution consisting of a solution of a chloride of a metal, hydrochloric acid and a wetting agent.

3. A method as set forth in claim 2 wherein said solution of a chloride of metal is a solution of palladium chloride.

4. A method as set forth in claim 2 wherein said solution of a chloride of metal is a solution of zinc chloride.

5. A method as set forth in claim 2 wherein said solution of a chloride of metal is a solution of stannous chloride.

6. A method as set forth in claim 2 wherein said solution comprises from 10% to 22% by weight hydrochloric acid, 1.5% to 3.5% by weight anhydrous stannous chloride, and the remainder of the solution water and a wetting agent.

7. A method as set forth in claim 6 wherein the solution further comprises 1% to 2% by weight palladium chloride.

8. A method as set forth in claim 6 wherein the board is immersed in the solution for 15 to 60 seconds at a temperature of 22±2° C.

9. A method as set forth in claim 2 wherein said solution comprises 10% by weight hydrochloric acid, 1.5% by weight anhydrous stannous chloride, and 88.5% water and wetting agents.

10. A method as set forth in claim 9 wherein said solution further comprises 1.0% by weight palladium chloride and the water and wetting agent comprise 87.5% by weight of the solution.

11. A method as set forth in claim 10 wherein the board is immersed in the solution for 50 to 60 seconds at a temperature of 22±2° C.

12. A method as set forth in claim 2 wherein said solution comprises 17% by weight hydrochloric acid, 2.5% by weight anhydrous stannous chloride and 80.5% water and wetting agent.

13. A method as set forth in claim 12 wherein said solution further comprises 0.5% by weight palladium chloride and the water and wetting agents comprise 80% by weight of the solution.

14. A method as set forth in claim 13 wherein said board is immersed in the solution for 25 to 35 seconds at a temperature of 22±2° C.

15. A method as set forth in claim 2 wherein said solution comprises 22% by weight hydrochloric acid, 3.5% by weight anhydrous stannous chloride and 74.5% by weight water and wetting agent.

16. A method as set forth in claim 15 wherein said solution further comprises 2.0% by weight palladium chloride and the water and wetting agent comprise 72.5% by weight of the solution.

17. A method as set forth in claim 16 wherein the board is immersed in the solution for 15 to 25 seconds at a temperature of 22±2° C.

18. A method of producing a printed circuit board comprising:
   a. coating a board with copper,
   b. drilling through-holes in said board,
   c. plating the through-holes with copper,
   d. laminating an etch-resist on said board in the form of a desired circuit,
   e. plating the circuit with nickel,
   f. etching the excess copper from the board,
   g. activating the nickel to accept solder, and
   h. coating the nickel with solder.

19. A method as set forth in claim 18 wherein activating the nickel comprises treating the nickel with a solution consisting of a solution of a chloride of a metal, hydrochloric acid and a wetting agent.

20. A method as set forth in claim 19 wherein said solution of a chloride of metal is a solution of palladium chloride.

21. A method as set forth in claim 19 wherein said solution of a chloride of metal is a solution of zinc chloride.

22. A method as set forth in claim 19 wherein said solution of a chloride of metal is a solution of stannous chloride.

23. A method as set forth in claim 19 wherein said solution comprises from 10% to 22% by weight hydrochloric acid, 1.5% to 3.5% by weight anhydrous stannous chloride, and the remainder of the solution water and a wetting agent.

24. A method as set forth in claim 23 wherein the solution further comprises 1% to 2% by weight palladium chloride.

25. A method a set forth in claim 23 wherein the board is immersed in the solution for 15 to 60 seconds at a temperature of 22±2° C.

26. A method a set forth in claim 19 wherein said solution comprises 10% by weight hydrochloric acid, 1.5% by weight anhydrous stannous chloride, and 88.5% water and wetting agents.

27. A method as set forth in claim 26 wherein said solution further comprises 1.0% by weight palladium chloride and the water and wetting agent comprise 87.5% by weight of the solution.

28. A method as set forth in claim 27 wherein the board is immersed in the solution for 50 to 60 seconds at a temperature of 22±2° C.

29. A method as set forth in claim 19 wherein said solution comprises 17% by weight hyrochloric acid, 2.5% weight anhydrous stannous chloride and 80.5% water and wetting agent.

30. A method as set forth in claim 29 wherein said solution further comprises 0.5% by weight palladium chloride and the water and wetting agents comprise 80% by weight of the solution.

31. A method as set forth in claim 30 wherein said board is immersed in the solution for 25 to 35 seconds at a temperature of 22±2° C.

32. A method as set forth in claim 19 wherein said solution comprises 22% by weight hydrochloric acid, 3.5% by weight anhydrous stannous chloride and 74.5% by weight water and wetting agent.

33. A method as set forth in claim 32 wherein said solution further comprises 2.0 % by weight palladium chloride and the water and wetting agent comprise 72.5% by weight of the solution.

34. A method as set forth in claim 33 wherein the board is immersed in the solution for 15 to 25 seconds at a temperature of 22±2° C.

* * * * *

UNITED STATES PATENT AND TRADEMARK OFFICE
CERTIFICATE OF CORRECTION

PATENT NO. : 4,024,631

DATED : May 24, 1977

INVENTOR(S) : Alphonso W. Castillero

It is certified that error appears in the above-identified patent and that said Letters Patent are hereby corrected as shown below:

In the Figure, bottom block, delete "COPPER" and insert --SOLDER--.

Signed and Sealed this

Thirtieth Day of May 1978

[SEAL]

Attest:

RUTH C. MASON
Attesting Officer

LUTRELLE F. PARKER
Acting Commissioner of Patents and Trademarks